(12) United States Patent
Herring et al.

(10) Patent No.: US 7,109,131 B2
(45) Date of Patent: Sep. 19, 2006

(54) SYSTEM AND METHOD FOR HYDROGEN-RICH SELECTIVE OXIDATION

(75) Inventors: Robert B. Herring, San Jose, CA (US); Cole Porter, San Jose, CA (US); Travis Dodwell, Apple Valley, CA (US); Ed Nazareno, San Jose, CA (US); Chris Ratliff, Felton, CA (US); Anindita Chatterji, Los Altos Hills, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 0 days.

(21) Appl. No.: 10/456,850

(22) Filed: Jun. 6, 2003

(65) Prior Publication Data
US 2004/0137755 A1   Jul. 15, 2004

Related U.S. Application Data

(60) Provisional application No. 60/387,185, filed on Jun. 6, 2002.

(51) Int. Cl.
*H01L 21/31* (2006.01)
*H01L 21/469* (2006.01)
*H01L 29/76* (2006.01)
*C23C 16/00* (2006.01)

(52) U.S. Cl. ............... 438/787; 438/773; 438/770; 438/786; 257/410; 257/411; 257/412; 257/E21.285; 257/E21.268; 257/E21.193; 257/405; 118/724; 118/725; 118/663; 118/707; 118/708

(58) Field of Classification Search ............... 438/787, 438/773, 592, 795, 591, 653, 257, 585, 770, 438/786; 257/388, 413, 751, 757, 750, E21.193, 257/E21.285, E21.268, 405, 410–412; 118/724, 118/725, 663, 707, 708
See application file for complete search history.

(56) References Cited

U.S. PATENT DOCUMENTS

| 5,240,875 | A | 8/1993 | Tsou |
| 6,005,225 | A | 12/1999 | Kowalski et al. |
| 6,066,508 | A * | 5/2000 | Tanabe et al. ............... 438/38 |
| 6,179,609 | B1 * | 1/2001 | Drimer et al. ............... 431/11 |
| 6,221,791 | B1 * | 4/2001 | Wang et al. ............... 438/773 |
| 6,291,868 | B1 * | 9/2001 | Weimer et al. ............. 257/413 |
| 6,335,295 | B1 * | 1/2002 | Patel ............................ 438/773 |
| 6,362,086 | B1 | 3/2002 | Weimer et al. |
| 6,441,350 | B1 * | 8/2002 | Stoddard et al. ............ 219/497 |
| 6,458,714 | B1 | 10/2002 | Powell et al. |
| 6,534,401 | B1 * | 3/2003 | Joo et al. ..................... 438/653 |
| 6,566,227 | B1 | 5/2003 | Wensley et al. |
| 6,774,012 | B1 * | 8/2004 | Narayanan ................... 438/471 |

FOREIGN PATENT DOCUMENTS

JP    2000247673 A  *  9/2000

* cited by examiner

*Primary Examiner*—David Zarneke
*Assistant Examiner*—Igwe U. Anya
(74) *Attorney, Agent, or Firm*—Dorsey & Whitney LLP (57) ABSTRACT

The present invention relates generally to semiconductor fabrication. More particularly, the present invention relates to system and method of selectively oxidizing one material with respect to another material formed on a semiconductor substrate. A hydrogen-rich oxidation system for performing the process are provided in which innovative safety features are included to avoid the dangers to personnel and equipment that are inherent in working with hydrogen-rich atmospheres.

10 Claims, 5 Drawing Sheets

SYSTEM AND METHOD FOR HYDROGEN-RICH SELECTIVE OXIDATION

CROSS REFERENCE TO RELATED APPLICATIONS

The present application claims the benefit of and priority from U.S. Provisional Patent Application Ser. No. 60/387,185, entitled System and Method for Hydrogen-Rich Selective Oxidation, filed Jun. 6, 2002 which is incorporated herein by reference in it's entirety.

FIELD OF THE INVENTION

The present invention relates generally to semiconductor fabrication. More particularly, the present invention relates to a system and method for selective oxidation of device features on semiconductors or integrated circuits in a hydrogen rich environment.

BACKGROUND OF THE INVENTION

Fabrication of semiconductor devices or integrated circuits requires many complex steps. Heat treatment is an important step in the fabrication of semiconductor devices and is used to carry out a variety of processes such as thermal annealing and thermal oxidation, among many other processes.

Figure 1:
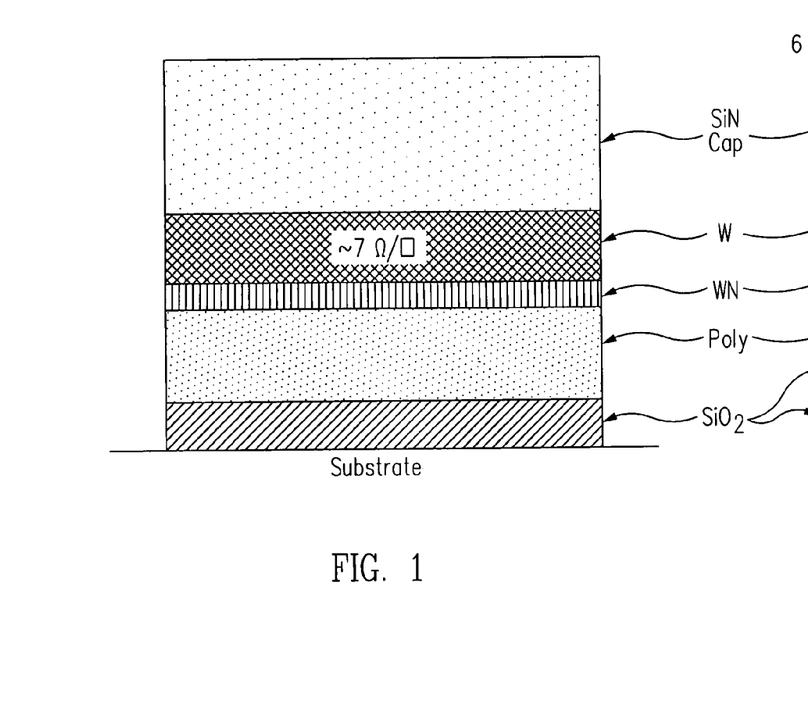
FIG. 1 is a cross-sectional view of a partially fabricated semiconductor device showing a gate electrode stack structure.

As well known in the art, semiconductor devices are made of a number of conductive and insulating features on a semiconductor substrate. Devices such as gate electrodes comprised of a gate stack including layers of materials such as polysilicon, dielectric, and metals are commonly used. For semiconductor devices having a critical geometry requirement of less than 130 nm, the polysilicon layer may be strapped over the top by a metal silicide layer. However, it has been found that the circuit performance of such a device is limited due to resistance of the device to device interconnect lines. To reduce the resistance of these interconnect lines, it has been proposed in the industry to replace the metal silicide layer and to fabricate the interconnect lines of polysilicon strapped over the top by a barrier layer and then a metal layer which exhibits a lower resistance than the metal silicide layer, as illustrated in FIG. 1.

Plasma etch processing is typically used to define the gate device. The plasma etch step leaves a roughened edge on the polysilicon layer and produces plasma induced damage near the gate dielectric layer at the bottom of the polysilicon layer. Such damage may cause device failure or degraded performance. Methods have been developed in an attempt to minimize such failure or degraded performance. Methods have been developed in an attempt to minimize such damage, and have included an oxidation step to form a thin oxide layer of approximately 5 to 15 nm thick on the sidewall of the polysilicon layer to repair the plasma damage caused in the plasma step.

It has been found however, that during this oxidation step used to repair the plasma damage, the oxygen-rich environment exposes the metal layer to attack and the oxidant can destroy the metal layer. To address this problem, selective oxidation processes have been investigated.

In one prior art approach, selective oxidation of gate electrodes having polysilicon and tungsten metal structures has been performed in single wafer reactors using a catalytic reactor which reacts hydrogen and oxygen to form partial pressure of water vapor in the reactor ambient. Such an approach suffers from disadvantages however, such as high cost of the catalytic reactor and low throughput (less than approximately 10 wafers per hour achievable by such a single wafer system).

Batch furnace systems have long been employed to carry out annealing processes in the fabrication of semiconductor wafers. Many batch annealing processes are carried out in a hydrogen environment (hydrogen anneal). In most annealing processes, hydrogen is diluted with nitrogen, and safety features such gas ratio interlocks are used to control the hydrogen to concentrations below the explosive or flammability limit. However, for some process applications annealing in an atmosphere of up to 100% hydrogen is required. Systems of this type incorporate use of circuits that force a timed nitrogen purge of the reactor or tube prior to the flow of hydrogen gas, and an automated post purge of nitrogen applied upon the termination of the flow of hydrogen gas. While this approach is useful, improvements are needed. Accordingly, improved systems and methods for selectively oxidizing one material with respect to another in the fabrication of semiconductor devices is desired.

OBJECTS AND SUMMARY OF THE INVENTION

It is a general object of the present invention to provide a system and method for selective oxidation of device features on semiconductors or integrated circuits in a hydrogen rich environment. In another aspect the present invention provides a system and method for selectively oxidizing one material with respect to another material on a semiconductor substrate or wafer, such as oxidizing polysilicon without oxidizing metal layers such as tungsten that are also present on the substrate.

In a further aspect, the present invention provides a hydrogen-rich oxidation system and method for performing selective oxidation in a batch thermal processing system in which safety features are included to avoid the dangers to personnel and equipment that are inherent in working with hydrogen-rich atmospheres.

In one aspect, the present invention provides a method of selectively oxidizing one material with respect to another material formed on one or more semiconductor substrates, comprising contacting the one or more substrates in a process chamber with an environment comprising approximately 10% to 30% steam and the balance hydrogen, at a temperature in the range of approximately 700 to 850° C. to form an oxide layer selectively on the one material.

In another embodiment present invention provides a system that includes a processing chamber. The processing chamber accommodates one or more substrates and is provided with a controllable gas flow system that supplies any or all of hydrogen, oxygen, nitrogen, or inert gases. A hydrogen-rich atmosphere is supplied to the processing chamber via a torch chamber. In the torch chamber, oxygen gas is reacted with hydrogen to produce steam. The substrate is selectively oxidized under the resulting steam and hydrogen ambient atmosphere. To facilitate safe operation of this system under hydrogen-rich conditions, a series of interlocks and dilution flow features are provided. A flame sensor is provided in the torch chamber to verify combustion of the oxygen-hydrogen mixture prior to its introduction to the processing chamber. A failure to detect ignition triggers an interruption of processing and inert gas is conveyed to the chamber at a high flow rate (also referred to as inert gas dilution flow) to dissipate potentially explosive concentrations of hydrogen. Likewise, a system power failure also triggers high flow rate inert gas dilution of the system.

Downstream of the processing chamber, a "burn box" is provided to function as a hydrogen afterburner that destroys unreacted hydrogen that passes the processing chamber and torch without reacting. Additional interlocks are provided that interrupt hydrogen flow and/or trigger inert gas dilution if the system fails one or more leak and pressurization tests.

BRIEF DESCRIPTION OF THE DRAWINGS

Additional objects and advantages of the invention will become apparent in reading the detailed description of the invention and the claims and with reference to the figures, in which:

DETAILED DESCRIPTION OF THE INVENTION

The present invention provides a system and method for selective oxidation of device features on semiconducts or integrated circuits in a hydrogen rich environment. More specifically, in one embodiment, one material is selectively oxidized with respect to another material, both materials being present on a semiconductor substrate or wafer.

Figure 2:
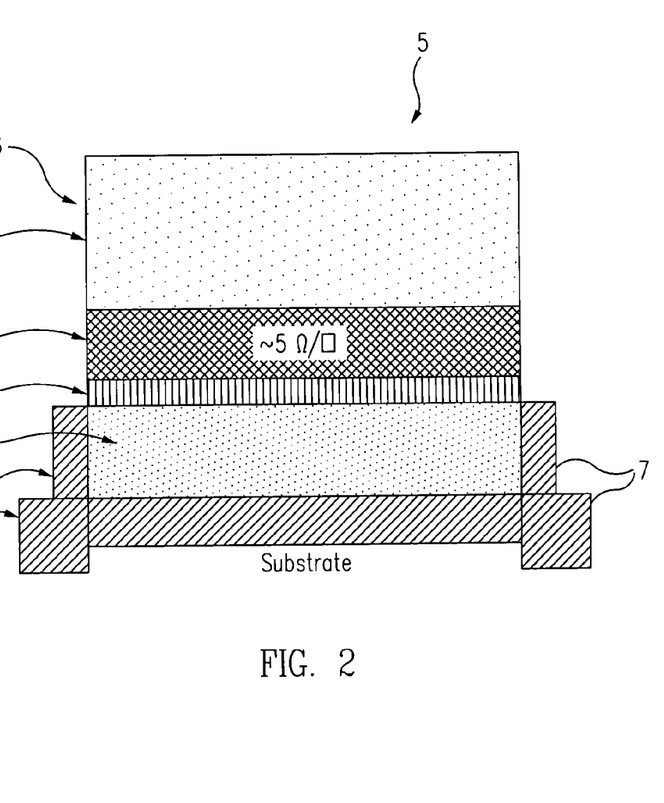
FIG. 2 is a cross-sectional view of a partially fabricated semiconductor device showing a gate electrode stack structure which has been selectively oxidized according to one embodiment of the present invention.

Referring to FIG. 2, a partially fabricated semiconductor device is shown. In this example a gate electrode stack 5 having side wall 6 is formed on a substrate as illustrated. Specifically the gate electrode is comprised of a substrate with a dielectric layer formed thereon. In this example the dielectric layer is formed of silicon dioxide. A polysilicon layer is formed atop the dielectric layer. A barrier layer, in this example a tungsten nitride material (WN) is formed atop the polysilicon layer. A metal layer is formed atop the barrier WN layer, and the metal layer is then capped. In this example the metal layer is formed of tungsten (W) and capped with silicon nitride (SiN).

Of particular advantage, the present invention provides for selectively oxidizing one layer or material in the gate stack with respect to another layer or material in the gate stack. Specifically, the side wall 6 region at the polysilicon layer is oxidized with a layer 7 of silicon dioxide, while the metal layer is not oxidized. This promotes lowering of the resistance of the device without damaging the metal layers in the device.

According to the present invention selective oxidation is carried out in a hydrogen rich environment. In general, semiconductor wafers are placed in a thermal processing chamber 12 (shown in FIGS. 3A and 3B and described in detail below). A hydrogen rich environment is created in the chamber 12, and this environment may be up to 100% hydrogen. Oxidation is carried out by exposing the wafers to steam in the hydrogen rich environment. In one embodiment steam is present in the chamber at a concentration in the range of approximately 10% to 30% with the balance being hydrogen.

The steam is created by reaction of hydrogen and oxygen in the presence of a flame in a torch chamber (creating a pyrogenic steam generator).

In one embodiment, the system of the present invention provides a torch with the hydrogen and oxygen supply inlets interchanged. In addition, the torch includes a flame sensor. The furnace is fitted with a "burn-box" in which unreacted hydrogen is combusted. Finally a series of safety interlocks are added to enhance safe operation of the system.

Figure 3A:
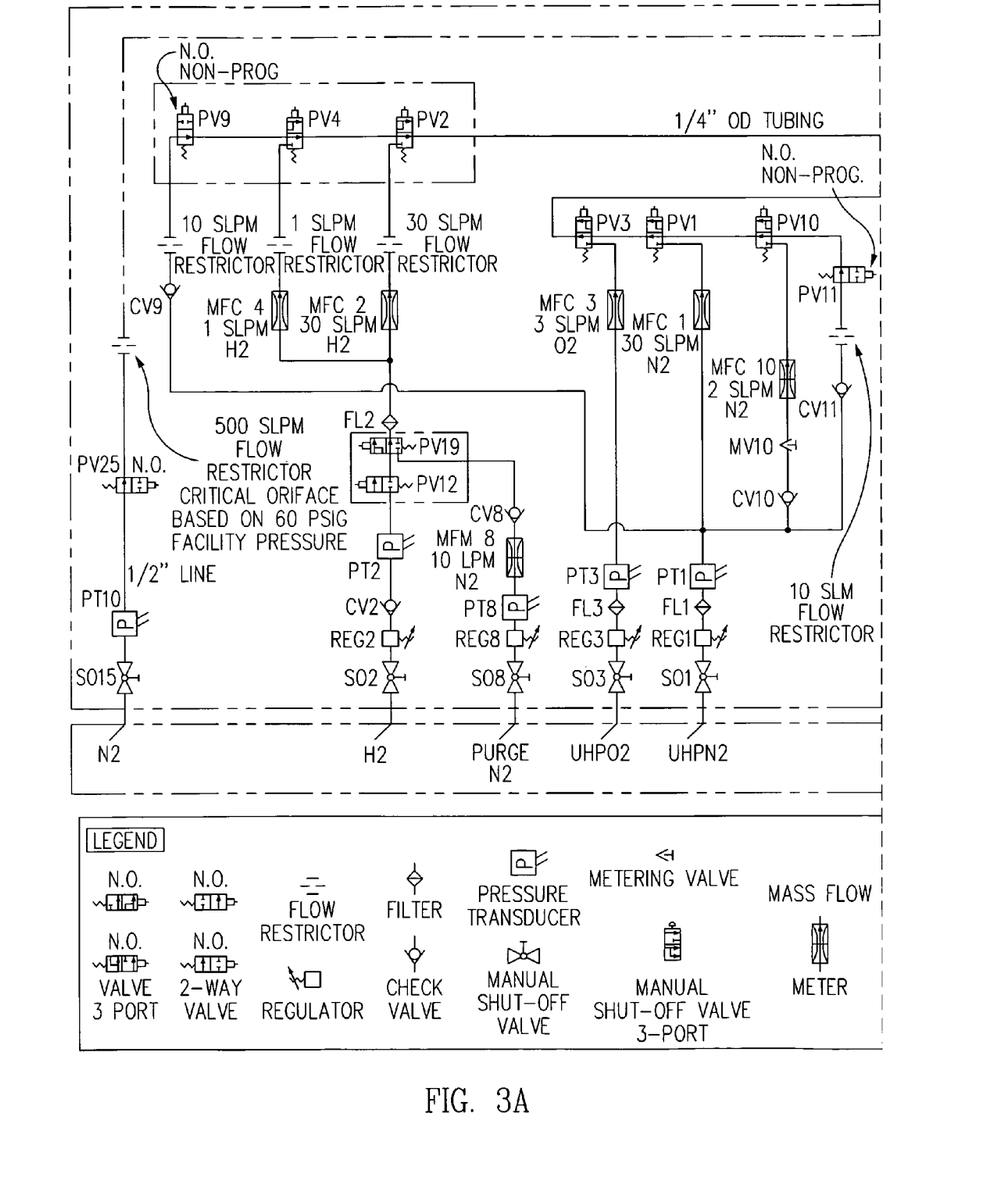
FIGS. 3A and 3B are a schematic diagram of a selective oxidation system according to one embodiment of the present invention.
Figure 3B:
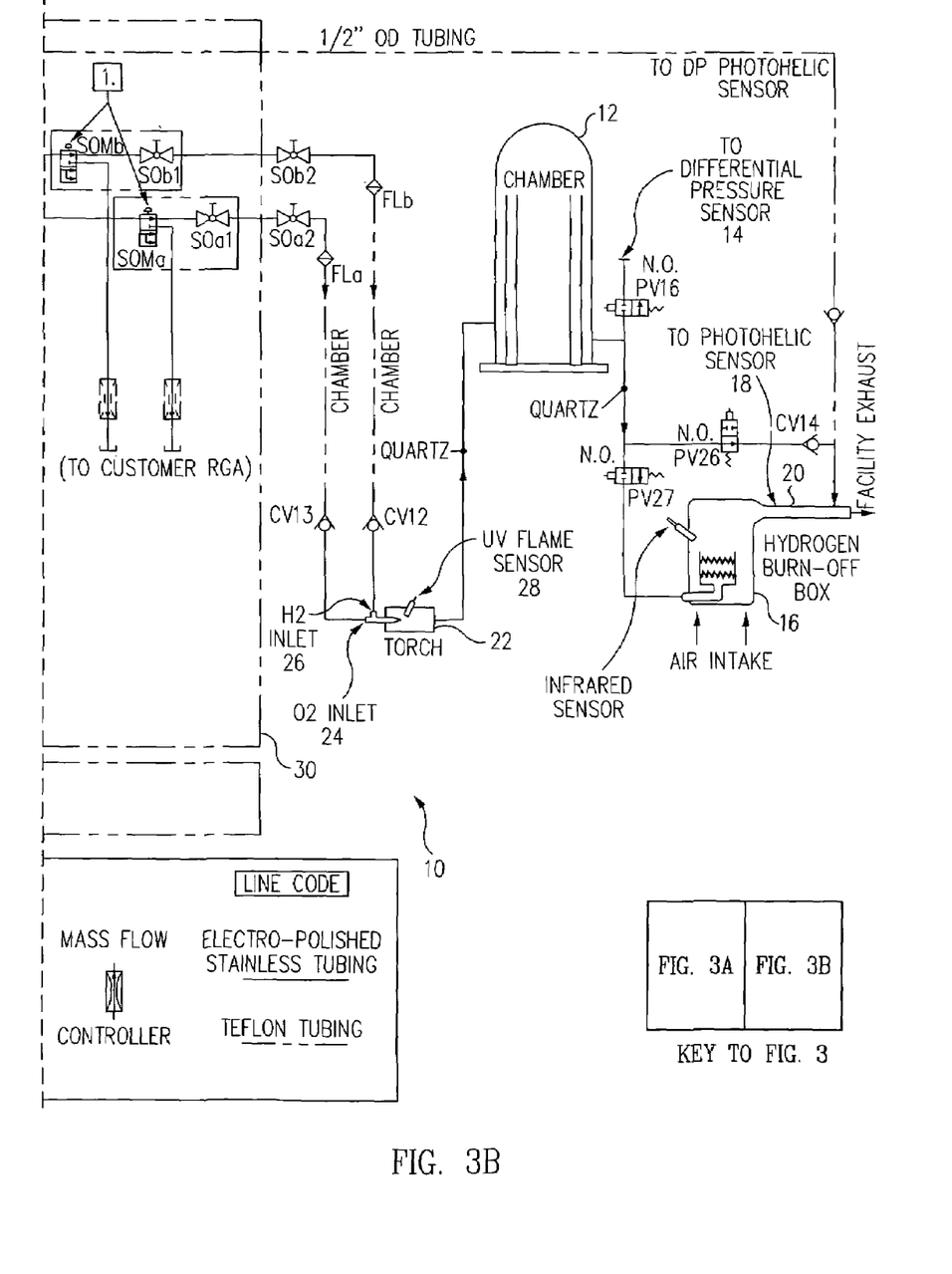

Generally, in one embodiment the system 10 of the present invention as shown in FIGS. 3A and 3B includes a thermal processing or furnace chamber 12 (also referred to as a tube or process tube) equipped with a pressure differential sensor 14; a hydrogen burn box 16 equipped with a pressure differential photohelix 18; an exhaust tube 20 leading from the burn box to the facility exhaust; a torch 22 including an oxygen gas inlet 24, a hydrogen gas inlet 26 (each oxygen and hydrogen inlets being coupled to respective gas cabinets, not shown), and a UV flame sensor 28. Sealed tubing is provided as appropriate such as leading from nitrogen, hydrogen, and oxygen gas supplies to corresponding gas inlets; and sealed tubing and appropriate check valves and filters are provided between the torch and the furnace chamber, and between the furnace chamber and the burn box.

As illustrated in FIGS. 3A and 3B, the thermal processing chamber 12 is generically shown, and it should be understood by those of ordinary skill in the art that other configurations of thermal processing systems may be used. One example of a suitable processing chamber, among many others, is described in U.S. Pat. No. 6,005,225, which is incorporated herein by reference in its entirety.

In general, the current invention provides a hydrogen/oxygen pyrogenic steam generator that can turn on and off in a hydrogen rich ambient to provide a means of water vapor generation controlled by a process recipe, a system to measure the leak integrity of the seals of the process chamber and interlocks not part of the user controlled recipe to prevent hydrogen flow until that leak integrity test is passed, and a safety interlock system that automatically activates a means of extracting unreacted hydrogen from the tube and diluting it with nitrogen to below hazardous levels in the event of an electrical power failure. Also provided is a method and system for detecting the presence of a hydrogen flame in the hydrogen-rich atmosphere of the torch.

The system of the present invention provides a pyrogenic steam generator by way of the torch chamber that can be turned on and off in a hydrogen rich ambient atmosphere to provide a controllable source of high purity water vapor. In contrast to prior art systems that generate water vapor by combusting hydrogen under lean (oxygen-rich) conditions, The system of the present invention provides a high concentration of hydrogen to a hydrogen-oxygen torch and then controls oxygen flow to the combustion region to produce a small flame that generates water vapor.

In another embodiment of the present invention, a hydrogen/oxygen pyrogenic steam generator that can turn on and off in a hydrogen rich ambient to provide a means of water vapor generation controlled by a process recipe is provided.

A further embodiment of the present invention provides a system to measure the leak integrity of the seals of the process chamber and interlocks to prevent hydrogen flow until that leak integrity test is passed.

Yet another embodiment of the present invention provides a system that automatically activates in case of an electrical power failure during hydrogen processing to provide a means of extracting the unreacted hydrogen from the processing tube and diluting it with nitrogen to below hazardous levels. This safety tube purge and abatement system operates even in the absence of electrical power.

To create an oxidizing atmosphere to oxidize polysilicon without oxidizing layers of metals such as tungsten on the semiconductor substrate, the resultant flame of the present invention is much smaller and less intense than those normally produced by a standard hydrogen torch. As such, prior art systems are inadequate to verify combustion and provide feedback to a system controller that uncombusted hydrogen is not flowing freely into areas of the system in which is might form an explosive mixture. The present invention employs a sensitive sensor located closer to the torch combustion region. Its output is directly fed back to the system process controller as an interlock that if triggered will cause hydrogen flow to be shut off and high flow rate dilution with an inert gas such as nitrogen to be initiated.

Figure 4A:
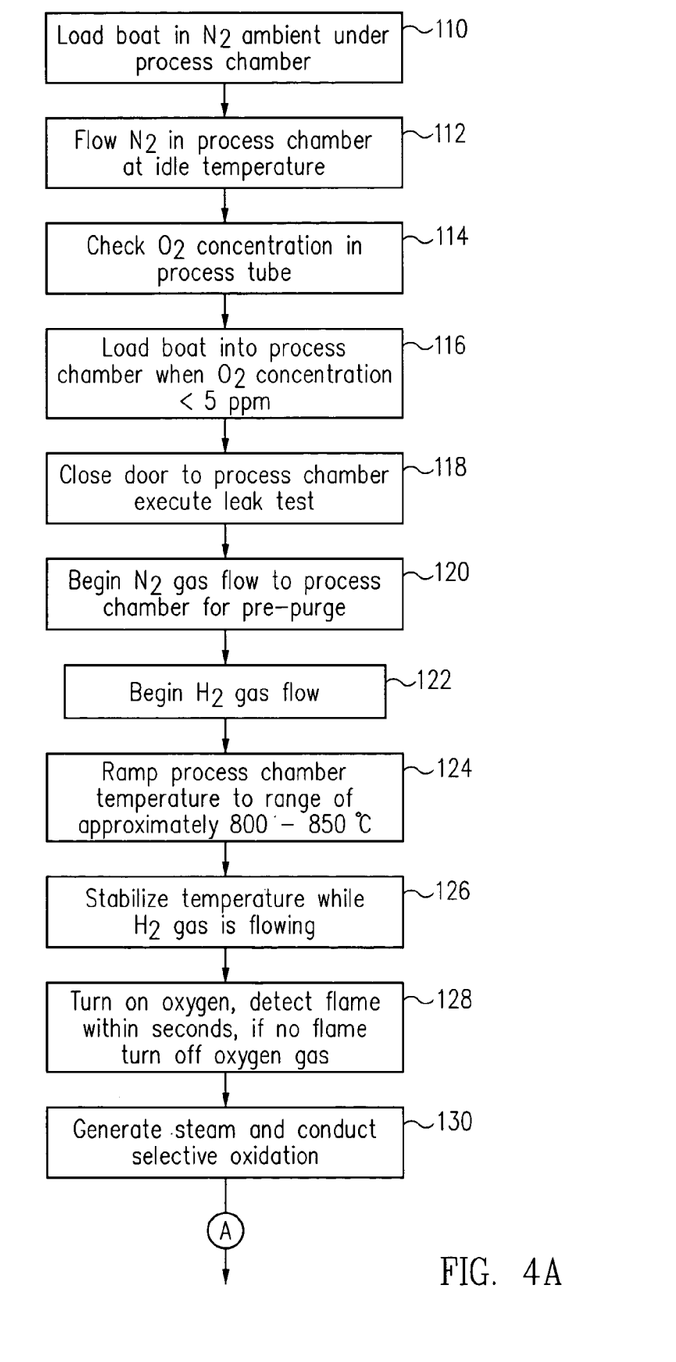
FIGS. 4A and 4B are a flow chart illustrating one embodiment of the method of the present invention.
Figure 4B:
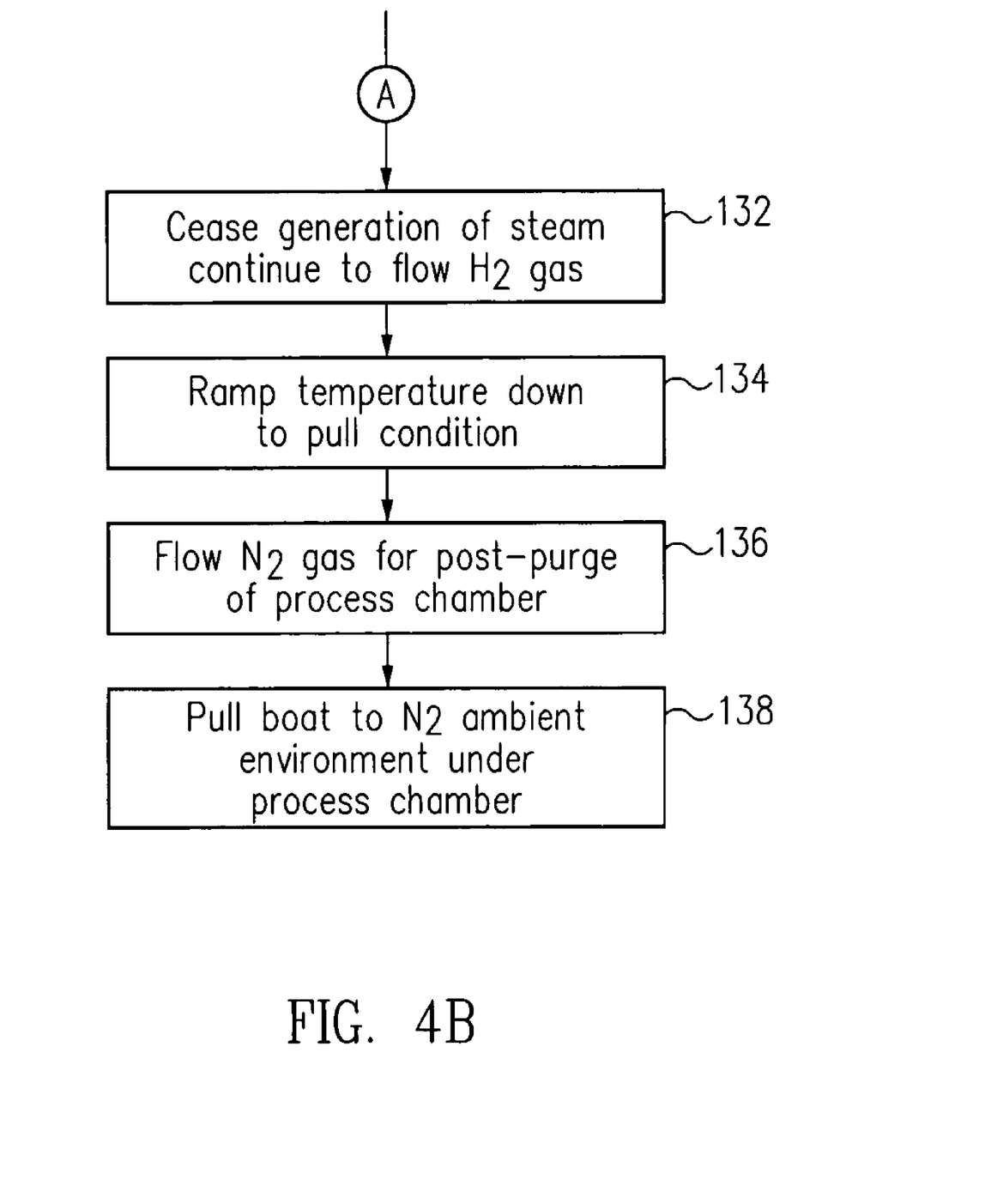

In one embodiment the method of the present invention includes the following steps as illustrated in FIGS. 4A and 4B to selectively oxidize device features on one or more wafers or substrates loaded in a wafer support such as a boat or cassette (not shown). The boat is loaded with wafers in a nitrogen ambient under the process chamber 12 as shown in step 110. An idling temperature of approximately 300–600° C. is established in the processing tube with nitrogen flowing at step 112. The nitrogen gas flow is sufficient to purge oxygen and other contaminants from the process chamber. In one embodiment, the nitrogen flow is approximately 10 standard liters per minute (slm). The oxygen concentration in the chamber is checked at step 114, and once the ambient atmosphere in the chamber is less than approximately 5 ppm oxygen, the boat supporting the wafers is inserted into the chamber 12 and the door is closed at step 116. With the chamber door closed at step 118, a test is executed to establish that the system is sealed with no major leaks such as, for example, would occur if the torch were disconnected. Once the door is closed, a nitrogen gas pre-purge is run through the processing chamber for approximately 10 minutes at step 120. Then at step 122 hydrogen gas flows to the chamber is begun at approximately 10 to 20 slm and the chamber temperature is ramped to 800° C. at step 124. After the temperature has stabilized with hydrogen flowing, oxygen gas flow to the torch is begun at step 128. If the flame is not detected by the oxy sensor 28 within a programmed period of time, the oxygen gas flow is stopped to avoid formation of a potentially explosive mixture on the processing chamber at step 128. Steam created by the reaction of hydrogen with oxygen in a concentration of approximately 10% to 30% steam with the balance hydrogen flows through the processing chamber and selectively oxidizes polysilicon without oxidizing metals such as tungsten metal formed on top of the polysilicon material at step 130. At the end of the selective oxidation step, the oxygen flow is shut off to terminate the generation of steam in step 132. At step 134 hydrogen gas continues to flow into the processing chamber while the temperature is ramped down. Once the temperature at which the boat is to be removed from the processing chamber is reached, the tube 12 is post-purged with nitrogen gas at step 136. The boat is pulled into a nitrogen ambient area under the tube for unloading of the wafers at step 138.

When the boat is pushed into the chamber 12, and the temperature in the process chamber is ramped up and stabilized at a temperature of 700 to 850° C. under a flow of nitrogen gas, and hydrogen flow is initiated during temperature stabilization; then a low flow rate of oxygen is initiated through the gas injector of the external torch 22. A small flame is formed that can preferably be detected by an optical sensor as a safety interlock to verify that the reaction of oxygen with hydrogen to form steam is in process.

To avoid oxidation of tungsten or other metal layers in the wafers, it is essential that no free oxygen be introduced into the process tube, and it is preferable that the partial fraction of the steam generated by reaction of the oxygen with the hydrogen be maintained at less than approximately 20%, with hydrogen comprising the balance of the atmosphere in the chamber.

The polysilicon material on the wafer is allowed to oxidize until a surface oxide layer of 5 to 15 nm has developed. Under the high hydrogen ambient in the presence of steam but without any free oxygen the tungsten metal is not oxidized. The process is terminated by switching off the oxygen gas flow, purging the tube of steam using hydrogen, switching to nitrogen and ramping temperature down to the value (typically 600° C.) used for push and pull of the boat containing the wafer batch load. It is important that the ambient environment in the chamber and under the chamber be maintained at less than approximately 1 ppm oxygen until the wafers have cooled to below 200° C.

Referring more specifically to FIGS. 3A and 3B which shows a schematic diagram of one embodiment of the present invention, the following detailed description is provided. It should be understood by those of ordinary still in the art that other specific configuration and programmable logic routes and alarms may be employed within the scope of the teaching of the present invention. This specific description is provided for illustration and is not intended to limit the scope of the invention. The gas flow schematic and interlock system 30, including associated valves, controller and the like, is generally shown in 3 FIGS. 3A and 3B. A field programmable gate array (FPGA, not shown) is a programmable integrated circuit device that can be used to program various outputs based on combinations of inputs. Programming of FPGAs is carried out by methods well known in the art. In the exemplary embodiment of the present invention, these inputs comprise valve commands from recipe control and alarm inputs from the system. FPGA outputs include qualified valve outputs to operate valves and qualified alarm outputs to the operating system. Safety of the system depends on the safety logic programmed into the FPGA and the redundant relay interlocks. A redundant relay interlock is provided as a the backup interlock system comprised of relay logic, employed in parallel with the FPGA. Its function is to interrupt power to selected solenoids in the event of a failure in the primary interlock system (FPGA and related electronics).

Hardware circuitry and firmware on the LCA board monitor for faults including whether the gas interface subsystem power supplies are out of tolerance, load faults in the programmable logic array configuration, detection of programmable logic array configuration corruption by the micro-controller auditor firmware, and general faults triggered by a process controller watchdog and a micro-controller Xilinx watchdog (Subsystem failure). These faults shut off power to hazardous gas valves and turn on an audible alarm as long as the condition exists. When the fault is cleared the gas valves will turn back on. These fault conditions are not latched.

In general, gas valves or automatic valves are valves located downstream from their associated mass flow controllers (MFCs). They are automatically given an ON command when a non-zero set point is sent to the MFC and they are automatically given an OFF command when a zero setpoint is sent to the associated MFC. As shown in FIGS. 3A and 3B, valves are identified with the same ID number as the associated MFC (for example, Valve 1 corresponds to MFC1, Valve 2 corresponds to MFC2, etc.). However, the ability of these valves to actually turn ON or OFF is individually controlled by interlock logic programmed within the FPGA.

Process valves or non-automatic valves generally control the process. This group includes all other valves in the gas system. They must be given an ON command via recipe control from the FPGA. However, like the automatic valves, the ability of these valves to actually turn ON or OFF is individually controlled by interlock logic programmed within the FPGA.

A gas system disabled (GSD) state occurs when power to selected gas valve solenoids and process control valve solenoids is removed. This is designed to be a safe state. A user interface is provided in this exemplary embodiment to indicate this state via sets of relay contacts. Certain alarms cause the system to enter this state. Once the tool enters this state it will remain in this state until the alarm causing the GSD has been cleared and the operator resets the system.

A valve is defined to be 'ON' if gas can flow through the valve. In the case of a normally open (N.O.) valve, the valve is 'ON' when the valve does not have power. Each valve in the gas system is controlled by a signal from the FPGA. Signals generated by the recipe are sent to the FPGA. The FPGA processes the signal by internal programmed logic. If interlock conditions are met, the FPGA outputs a signal to a valve driver to control the valve. Redundant shutoff is provided to selected valves by relay logic. There are four relay loops on the valve driver board that can be programmed to shut off selected valves. These loops are designated "A, B, C, and D". In addition to the four relay loops on the valve driver board a non-interruptible fifth loop (E) is provided for those valves that do not require relay interruption of power.

When certain interlocks programmed in the FPGA device are violated the FPGA places the system in a latched GSD State. Upon entering this state, an audible alarm is sounded that may be silenced via a push-button switch located on the rear of the main unit, labeled "SILENCE ALARM", or at the front panel by clicking the mouse on a software-displayed button on the CRT. The indicator in the "SILENCE ALARM" switch is then turned ON to indicate that the alarm has been silenced. Once the alarm-causing condition has been cleared, the system must be manually reset via a lighted "RESET GAS SYSTEM DISABLE" push-button switch also located on the rear of the main. In this exemplary embodiment unless otherwise specified, the following alarms always cause the tool to enter the GSD State: Gas Cabinet Exhaust Fault (Alarm 5), Element Exhaust Fault (Alarm 8), Cabinet Over Temperature (Alarm 10), Burn-off Exhaust Fault (Alarm 11), Gas Cabinet Door Open (Alarm 14), Element Removal (Alarm 33), External System Disable Request (Alarm 37), Nitrogen Pressure Low (Alarm 28—if hydrogen is flowing). These alarms are discussed in greater detail in the succeeding paragraphs. Of course, other configuration and alarms may be employed within the scope of the invention.

Certain critical alarms are used to actuate relays as well as inputs to the FPGA. If one of these alarms become active, the associated relay de-energizes removing power from the selected valves to provide redundant shutoff. Most alarms that cause the FPGA to go into the GSD state are backed up by relays. Unless otherwise specified, the following GSD alarms are backed up by a hardware relay: Gas Cabinet Exhaust Fault (Alarm 5), Element Exhaust Fault (Alarm 8), Scavenger Exhaust Fault (Alarm 11), Gas Cabinet Door Open (Alarm 14), and Element Removal (Alarm 33). Unless otherwise specified, the Process Door Open (Alarm 6) and AC Power Fault (Alarm 32) alarms shut off the power to System Disable Valves by relay action and by FPGA logic without causing GSD State. The Element Door Open (Alarm 59) and Gas System Watchdog (Alarm 38) alarms interrupt power to System Disable Valves by relay action only.

All valves that enable a process gas considered hazardous to personnel or equipment are considered System Disable Valves. In this exemplary embodiment of the present invention, the following valves are Gas System Disable Valves: High Hydrogen (Valve 2), Low Hydrogen (Valve 4), Hydrogen Enable (Valve 12), Hydrogen Manifold Purge (Valve 9—Normally Open Valve), Oxygen (Valve 3), and Oxygen Manifold Purge (Valve 11—Normally Open Valve).

When a power monitor relay de-energizes due to the system losing AC Power, a power fail signal (Alarm 47) is sent to the Process Controller. This same Power Fail signal also triggers an approximately 30-second delay circuit. After the 30-second delay circuit has timed out an AC power fault (Alarm 32) is generated. Alarm 32 starts an approximately 120-second timer. During this approximately 120-second period, the system operating on uninterruptible power supply power saves critical data before going into a controlled shutdown. After the approximately 120-second timer times out, an EPO signal is generated and all power to the system is removed. However, should AC Power come "back up" before Alarm 32 becomes active, the system will not go into the EPO condition. In that case processing will continue as before power loss.

Logic within the FPGA provides a run-time signal to drive a gas hour meter for monitoring the primary process gas flow. In this system the process gas monitored is hydrogen (H2). The following conditions send a signal to the GHM:

High H2 (Valve 2) or Low H2 (Valve 4) and H2 Enable (Valve 12) must be on.

Two automatic nitrogen gas purges are included in this exemplary embodiment. A system disable or power down purge occurs if the system enters the system disable state or if system power is lost. A timed pre-processing purge occurs if hydrogen flow is enabled (Valve 12) and a timed post-processing purge occurs if hydrogen processing is interrupted for any reason. The hydrogen manifold is purged via ultra high purity nitrogen (Normally Open Valves 9 and 11) through a 10 slm flow restrictor. A purge of the hydrogen manifold by the two nitrogen valves described above begins immediately upon entering the gas system disabled state and continues unabated until the system is manually reset. At that time, when the system is reset, Valves 9 and 11 are energized into their normal non-flow states, ending the purge. This purge will occur in every case of Gas System Disabled state except that caused by N2 Pressure Low Alarm 28 as described below. If system power is lost, the normally open purge valves will open and the H2 manifold will purge indefinitely.

A timed pre-processing and post-processing inert gas purge is initiated at the beginning and end of a Gas System Disabled state caused by nitrogen Pressure Low (Alarm 28), while hydrogen gas is flowing. Additionally, these purges are initiated upon enabling hydrogen flow through Valve 12. Purges are also commanded whenever hydrogen gas flow is interrupted for any reason during hydrogen processing. During timed pre-processing and post-processing purges, Alarm 36 (Elevator Disabled) is activated to disable the elevator mechanism. Alarm 19 (Pre/Post Purge). A status indicator will also be sent to the Process Controller. Purge valves 9 and 11 are de-energized to their flow states and a countdown of approximately 10 minutes starts. If, after the purge begins, and before it completes, a low nitrogen pressure alarm (Alarm 28) occurs, the purge countdown is suspended on each occurrence until the nitrogen pressure returns to a non-alarm level, and won't complete until a cumulative approximately 10 minutes of nitrogen purging has taken place. Alarm 19 will indicate constantly from the time that purge starts until the purge is completely finished, and the elevator will be disabled by Alarm 36 (Elevator Disabled). At the completion of pre-processing and post-processing purges and after the system disable alarm is reset, both Valves 9 and 11 are energized into their normal non-flow states.

The system includes a hydrogen burn box 16 that must be on when hydrogen gas is flowing. In the exemplary embodiment, the burn box contains dual igniters (igniter 31 and igniter #2) that are powered from 120 volts AC and act as an "afterburner" to combust unreacted hydrogen before it is vented to the exhaust system. The main igniter (igniter #1) is turned on by logic in the FPGA when the pre-processing purge begins and remains on until after the post-processing purge has completed. The burn box is also equipped with a redundant stand-by igniter (igniter #2) which is activated if the igniter #1 fails. Circuits in the burn box perform the switch over if this fault condition is detected. Valve 18 output is assigned as the burn box ON command. This valve can be turned on from the recipe for maintenance purposes. However if the ON command is generated from FPGA safety logic the recipe cannot turn off the burn box. Two Alarm outputs from the burn box report the integrity of the igniters. Alarm 12 indicates igniter #1 is open and igniter #2 is active. Alarm 13 indicates igniter #2 is open and the burn box can no longer burn hydrogen. Alarm 13 aborts the hydrogen process and starts the post-processing purge.

Preferably, a pressure differential photohelix 16 located near the process tube monitors the pressure difference between the inside of the process chamber 12 and the outside pressure. Before hydrogen gas can flow, a leak test is preformed to check the integrity of the tube seal. In one example an automatic leak test is performed by logic in the FPGA upon closing of the process door. The operator initiates an automatic leak test by activating Valve 16 from the operator recipe if the tool is not processing or purging and the process door is closed. Automatic leak testing is performed by first opening Valve 27 for approximately 10 seconds to relieve any pressure in the tube. Then, Valve 16 is opened to enable the differential pressure sensor. The chamber exhaust flow is sealed off by closing Valves 26 and 27. Next, Valve 10 is opened to allow nitrogen gas to flow to the chamber at the rate of approximately 1 slm through needle valve MV10. When a preset upper differential limit is reached as evidenced by Alarm 25 becoming active, Valve 10 is closed to stop the nitrogen gas flow. If Alarm 25 does not activate within approximately 3 minutes, the leak test fails and Alarm 7 is activated. The pressure differential is monitored for approximately 3 minutes. If the differential pressure stays above the preset lower limit, the test is passed. If the test fails, Alarm 7 is activated and remains on until the door is opened, the leak repaired and a retest of the door seal passes. At the end of the leak test, Valve 27 opens for approximately 10 seconds to equalize pressure in the processing chamber or tube. After the equalization period, Valve 16 closes, thus sealing off the differential pressure sensor.

In the exemplary embodiment, the temperature of the torch 22 must be greater than 750° C. before oxygen gas can flow. Alarm 1 (Torch Temperature Below 750° C.) functions as an oxygen process scenario start-up alarm only, and as such, has no effect once oxygen gas is flowing; the alarm then being "masked" (transparent to system operation) by FPGA logic. The torch temperature must remain in the range of approximately 350° C. to 900° C. while oxygen gas is flowing, otherwise oxygen gas flow will be turned off. Alarm 2 (Torch Temperature Between 350 and 900° C.) is a "masked" alarm. It is not be passed to the Process Controller for status, nor is it used for interlocks by the FPGA, unless oxygen and hydrogen gases are flowing. Once the alarm occurs, it is latched within the FPGA until a zero setpoint command is sent to the oxygen MFC.

In one exemplary embodiment, the flame detector 28 at the torch must detect a flame within 15 seconds after oxygen gas begins flowing, or else oxygen gas flow is forced off. Any loss of flame after initial ignition will cause an immediate activation of Alarm 3 (Flame Detect), shutting off oxygen flow as well. Alarm 3 is a "masked" alarm; meaning that it is not passed to the Process Controller for status, nor is it used for interlocks by the FPGA, unless oxygen and hydrogen gases are flowing. Once the alarm occurs, it is latched within the FPGA until a zero setpoint command is sent to the oxygen MFC.

Alarm 4 (Hydrogen/Oxygen ratio Less than 2.15) is activated if the ratio of hydrogen flow to oxygen flow is less than approximately 2.15:1. Alarm 4 is a "masked" alarm; meaning that it is not passed to the Process Controller for status, nor is it used for interlocks by the FPGA, unless oxygen and hydrogen gases are flowing. Once the alarm occurs, it is latched within the FPGA until a zero set point command is sent to the oxygen MFC.

Loss of gas cabinet exhaust for approximately 10 seconds as monitored by a photohelic sensor causes Alarm 5 (Gas Cabinet Exhaust Fault) to be generated. This alarm shuts off process gas flows and causes the system to enter the latched gas system disabled state.

Several alarms provide input to the FPGA. Alarm 6 (Process Door Open) becomes active when the process chamber door is open. If the chamber leak test described above is failed, Alarm 7 (Leak Test Failure) is activated. Detection of a fault in the facility exhaust triggers Alarm 8 (Facility Exhaust Faut) which is a GSD alarm backed up by a relay. Loss of element exhaust for approximately 10 seconds as monitored by the aforementioned photohelic sensor causes activation of Alarm 8. This alarm shuts off process gas flow and causes the system to enter the latched gas system disable state. This alarm also turns on the nitrogen dilution valve (Valve 25) if hydrogen flow is on or if the tool is in the purge mode. Once facility exhaust is restored and Alarm 8 is deactivated, Valve 25 turns off, stopping the nitrogen dilution flow. The tool remains in the GSD state until the operator resets the tool. Detection of hydrogen gas by a sensor causes Alarm 9 (Hydrogen Leak Detect) to become active. This alarm shuts off hydrogen and oxygen gas flows. Three hydrogen sensors are located in the gas cabinet, above the torch and in the upper cabinet. These sensors are configured to generate Alarm 9 if any sensor detects hydrogen. These sensors are set to detect 25% of the lower explosive limit for hydrogen. If a temperature sensor in the top of the main cabinet detects a temperature greater than approximately 62° C., Alarm 10 (Cabinet Over Temperature) is activated. This alarm shuts off process gas flow and causes the system to enter the latched Gas System Disable State. Loss of burn-off exhaust for approximately 10 or more seconds as monitored by the aforementioned photohelic sensor generates Alarm 11 (Burn-Off Exhaust Fault).

This alarm shuts off process gas flow and causes the system to enter the Gas System Disable State. Alarm 12 (Burn-Off Igniter #1 Fault) becomes active if igniter #1 opens. If this alarm is activated before hydrogen processing is initiated, hydrogen flow through Valve 2 is inhibited. If Alarm 12 becomes active after hydrogen processing has begun, hydrogen flow is not affected. Under this condition, the alarm is merely advisory. The alarm is masked until approximately 5 seconds after initial turn on of the burn box. Once active, Alarm 12 remains on until the hydrogen enable valve (Valve 12) is commanded off by recipe.

Alarm 13 (Burn-Off Igniter #2 Fault) becomes active if igniter #2 opens. This alarm aborts hydrogen processing and starts a timed post-processing purge with nitrogen gas. This alarm is masked for approximately 5 seconds after Alarm 12 becomes active to allow for igniter switch over and heat up. Once active, Alarm 13 remains on until the hydrogen enable valve (Valve 12) is commanded off by the recipe. When the gas cabinet door is open Alarm 14 (Gas Cabinet Door Open) becomes active. This alarm shuts off process gas flows and causes the system to enter the latched Gas System Disable State. Alarm 16 (Low Water Flow) occurs if the water flow falls below the preset minimum flow rate. This alarm is advisory only and is not used to interlock valves. Alarm 18 (Nitrogen Dilution Pressure Low) is active if the facility environmental nitrogen source pressure measured by PT 10 is below approximately 60 psig. Alarm 18 is used as an hydrogen process scenario start-up alarm only. Once hydrogen gas is flowing the alarm is then advisory only. Alarm 19 (Timed Pre/Post Purge) occurs if the system goes into a timed automatic purge as described above. This alarm remains on until a cumulative approximately 10 minutes of purging with nitrogen gas has completed. This alarm triggers Alarm 36 which disables the elevator. It also forces valves 9, 11 and 27 'ON' in addition to forcing on the burn box valve (Valve 18).

If the system goes into the gas disabled state, Alarm 20 (Gas System Disable) becomes active. Alarm 21 (Leak Test) becomes active during the Leak Test and remains on until Leak Test has completed. It is an advisory alarm only. Other masked and/or advisory alarms are discussed below. Alarm 22 (MFM 10 (N2) FLOW<1 slm) becomes active if Valve 10 is on and the nitrogen gas flow through the loop is less than 1 slm. It is a masked advisory alarm. Alarm 24 (Burn Off IR Sensor Fault) is also masked. It becomes active if the temperature of the hydrogen burn-off igniters falls below the preset limit. This alarm is masked until 10 seconds after the burn off is commanded on. If while the process door is closed the differential pressure between the process chamber and the outside exceeds the preset upper limit Alarm 25 (Differential Pressure High) is activated. If this alarm occurs all gas flow into the tube is shut off to prevent overpressuring the tube. Alarm 26 (High Hydrogen Flow) occurs if hydrogen gas flow via MFC2 exceeds 90% of full scale flow. Alarm 26 is a "masked" alarm. It is passed to the Process Controller for status, nor will it be used for interlocks by the FPGA, unless hydrogen gas is flowing. This alarm is advisory only and is not used to interlock valves. Alarm 27 (Pneumatic Pressure Low) becomes active if the pneumatic pressure is less than 60-psig+5 psig as measured by a pressure switch in the pneumatic line.

Alarm 28 (Nitrogen Pressure Low) is a conditional alarm that becomes active if the nitrogen gas line purge pressure is below 10-psig-+5 psig as measured by pressure transducer PT 1. If hydrogen gas is flowing or if the system is purging at the time this alarm becomes active, the system enters the GSD state. At that time all process gases are shut off and the elevator is disabled. Alarm 29 (Hydrogen Pressure High) becomes active if hydrogen pressure is more than 60 psig as measured by pressure transducer PT2. This alarm aborts hydrogen processing.

Alarm 30 (Oxygen Pressure Low) becomes active if oxygen pressure is less than 12 psig as measured by pressure transducer PT3. Alarm 32 (AC Power Fault) is activated when AC input power is lost for more than approximately 30 seconds+5 seconds. This alarm shuts off process gas flows and seals off tube. Alarm 33 (Element Removal) is a GSD alarm backed up by a relay that is activated when the chamber is moved from its normal processing position. This alarm shuts off process gas flows and causes the system to enter the gas system disable state.

Alarm 34 (Hydrogen Flowing) is an advisory alarm activated when hydrogen is flowing through MFC2. This alarm is advisory only and is not used to interlock valves. Alarm 35 (Torch Shield Open) becomes active if the torch shield is open. Alarm 36 (Elevator Disable) is a reporting alarm only with no interlocks and is generated by the logic within the FPGA when hydrogen gas is flowing and/or during the timed nitrogen pre-processing and post-processing purges. Alarm 37 (External Gas System Disable Request) is a GSD Alarm generated by the operator and routed to the tool via the operator I/O panel. This alarm shuts off process gas flows and causes the system to enter the latched gas system disable State as defined above. It functions as a manual override for emergency shutdown of the system by the operator.

A gas system watchdog circuit (Alarm 38) located on the LCA board monitors the integrity of the process controller. This circuit monitors a periodic signal sent by the process controller. If the circuit fails to receive this signal within approximately 10 seconds, a watchdog alarm is generated. This alarm disables a relay and shuts off GSD valves. This alarm is not latched.

Finally, Alarm 59 (Element Door Open) becomes active when the heater door is opened. This alarm disables a relay and shuts off GSD valves. This alarm is not latched.

EXPERIMENTAL

For initial process testing, the flame detection feature of the standard oxidation system was bypassed and door sealing was verified by manual inspection and use of a portable handheld hydrogen monitor. This testing revealed the need for a method to verify chamber sealing before hydrogen is turned on. In addition, a required safety feature to be added was identified: in the event of a power outage, the system should purge the tubing and chamber of hydrogen to avoid the possibility of formation of an explosive mixture. Finally, tests showed that the small flame generated by the low process oxygen flow was not detected by the standard thermal oxidation flame sensor and a change was needed to enable flame detection to be used as a system safety interlock in the selective oxidation process.

The solutions developed for these three design issues are novel features which contribute to system safety for the hydrogen rich oxidation system and are described in greater detail below. The exhaust line from the tube is equipped with a valve. Upon sensing the closure of the process tube door, the firmware initiates an automated sequence in which the exhaust line valve is closed to prevent outflow of gas. Then valves controlling a flow of nitrogen into the tube through a fixed orifice restrictor are opened until the internal pressure is sensed to have reached a certain level. Next, the nitrogen valves are closed and a timed test period is begun. The pressure is monitored in the tube during the test period to verify that it remains above a lower threshold pressure throughout the test period. The time and lower pressure level are selected to detect leaks from seals or damaged parts. This period is typically 30 seconds, but other periods are acceptable. Hydrogen flow to the process chamber is enabled only upon passing of this pressure test.

In the case of a power failure, the exhaust valve from the tube is closed and a valve opened to a bypass which is connected by a "Tee" to a source of high flow nitrogen. The high flow nitrogen dilutes the hydrogen and steam in the tube to concentrations below the flammability limits (<4% H2) and the mixed gas (forming gas) is exhausted into the process gas exhaust duct supplied by the building in which the system is installed. This prevents accumulation of hydrogen at potentially flammable or even explosive levels if a system power failure occurs.

The standard flame detector is sensitive to UV radiation coming from an area approximately 2 inches downstream of the tip of the gas injector. By modification of the water cooled housing, the mounting angle of the UV detector was changed so it sensed the area nearer the tip of the injector and became usable for the selective oxidation process which only produces a small flame size.

As taught by the foregoing description and examples, a system and method of selectively oxidizing semiconductor wafers and other substrates in a hydrogen-rich atmosphere is provided by the present invention. The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

What is claimed is:

1. A method of selectively oxidizing one material with respect to another material formed on one or more semiconductor substrates, comprising:
    generating in a torch chamber a mixture of steam comprising approximately 10% to 30% steam and the balance hydrogen by flowing hydrogen and oxygen into said torch chamber;
    contacting the one or more semiconductor substrates in a process chamber with said mixture of steam at a temperature in the range of approximately 700 to 850° C. to form an oxide layer selectively on the one material;
    sensing existence of a flame with a flame sensor positioned in said torch chamber and close to a flame combustion region within said torch chamber, an output signal of said flame sensor being coupled directly to a process controller;
    if said output signal fails to indicate the existence of a flame in said torch chamber within a programmable amount of time, interrupting the flow of hydrogen to said torch chamber and starting high flow rate dilution with an inert gas;
    detecting leaks in said processing chamber with a pressure sensor positioned in said processing chamber and if said pressure sensor detects a leak in said processing chamber,
    interrupting the flow of hydrogen to said torch chamber;
    combusting any unreacted hydrogen which passes through said torch and processing chambers; and
    in the event of an electrical power failure, extracting any unreacted hydrogen from said torch and processing chambers and diluting it with nitrogen to below hazardous levels.

2. The method of claim 1 wherein the same method selectively oxidizes polysilicon material and does not substantially oxidize a metal material on said one or more semiconductor substrates.

3. The method of claim 1 further comprising: heating the processing chamber to a temperature in the range of approximately 800 to 850° C.; and
    oxidizing the one material with respect to the other material.

4. The method of claim 3 wherein the oxidizing step is carried out for a time sufficient to form a layer of approximately 100 Å of silicon dioxide on the one material.

5. The method of claim 1 wherein the one material is polysilicon and the other material includes metal tungsten.

6. A method for selectively oxidizing one material with respect to another material on one, or more substrates, comprising the steps of:
    reacting hydrogen and oxygen in a torch chamber to generate a mixture of steam in a hydrogen rich atmosphere;
    flowing said mixture of steam and hydrogen to a processing chamber containing said substrates;
    sensing the existence of said flame with a flame sensor positioned in said torch chamber and close to a flame combustion region within said torch chamber, an output signal of said flame sensor being coupled directly to a process controller;
    if said output signal fails to indicate the existence of a flame in said torch chamber within a programmable amount of time, interrupting the flow of hydrogen to said torch chamber and starting high flow rate dilution with an inert gas;
    detecting leaks in said processing chamber with a pressure sensor positioned in said processing chamber and if said pressure sensor detects a leak in said processing chamber,
    interrupting the flow of hydrogen to said torch chamber;
    combusting any unreacted hydrogen which passes through said torch and processing chambers; and
    in the event of an electrical power failure, extracting any unreacted hydrogen from said torch and processing chambers and diluting it with nitrogen to below hazardous levels.

7. A system for processing one or more substrates with steam in a hydrogen-rich atmosphere comprising:
    a torch chamber; said torch chamber receiving gas supply of hydrogen and oxygen and generating a flame in said torch chamber to produce an atmosphere of steam in hydrogen;
    a processing chamber into which said substrates are placed for processing, said processing chamber provided with the atmosphere of steam in hydrogen from the torch chamber via a sealed tubing network;
    a flame sensor in said torch chamber for detecting the flame, said flame sensor providing feedback to an interlock system, said interlock system interrupting the gas supply of hydrogen to said torch chamber and starting high flow rate dilution with an inert gas if said flame sensor does not detect the flame within a programmable amount of time, said interlock system extracting any unreacted hydrogen from said torch and processing chambers and diluting it with nitrogen to below hazardous levels in the event of a power failure;

a pressure sensor in the processing chamber, said pressure sensor providing feedback to said interlock system regarding the leak integrity of said processing chamber, said interlock system interrupting the gas supply of hydrogen to said torch chamber if said pressure sensor detects a leak; and a burn box coupled to the processing chamber, said burn box receiving outflow from said processing chamber prior to delivery of said outflow to an exhaust system, said burn box providing one or more igniters for combusting any unreacted hydrogen which passes through said torch and processing chambers.

8. The system of claim 7 wherein steam is present at a concentration of approximately 10% to 30% in the processing chamber with the balance being hydrogen.

9. The system of claim 7 wherein steam is present at a concentration of up to 20% in the process chamber with the balance being hydrogen.

10. The system of claim 7 wherein said processing chamber is adapted to receive a boat supporting a plurality of semiconductor wafers.

* * * * *